(12) United States Patent
Sakurada

(10) Patent No.: US 10,320,429 B2
(45) Date of Patent: Jun. 11, 2019

(54) MEMORY CONTROLLER, MEMORY SYSTEM AND MEMORY CONTROL METHOD

(71) Applicant: Toshiba Memory Corporation, Minato-ku (JP)

(72) Inventor: Kenji Sakurada, Yamato (JP)

(73) Assignee: Toshiba Memory Corporation, Minato-ku (JP)

( * ) Notice: Subject to any disclaimer, the term of this patent is extended or adjusted under 35 U.S.C. 154(b) by 34 days.

(21) Appl. No.: 14/790,331

(22) Filed: Jul. 2, 2015

(65) Prior Publication Data

US 2016/0259683 A1    Sep. 8, 2016

Related U.S. Application Data

(60) Provisional application No. 62/127,942, filed on Mar. 4, 2015.

(51) Int. Cl.
*H03M 13/45* (2006.01)
*G11C 11/56* (2006.01)
(Continued)

(52) U.S. Cl.
CPC ......... *H03M 13/45* (2013.01); *G06F 11/1012* (2013.01); *G11C 11/5642* (2013.01);
(Continued)

(58) Field of Classification Search
CPC ..... G06F 11/1068; H03M 13/45; G11C 29/52
See application file for complete search history.

(56) References Cited

U.S. PATENT DOCUMENTS 8,458,563 B2   6/2013  Sharon et al.
8,576,622 B2   11/2013 Yoon et al.
(Continued)

FOREIGN PATENT DOCUMENTS

JP    2010-192049 A    9/2010
JP    2012-113809 A    6/2012

OTHER PUBLICATIONS

Y. Cai et al., "Threshold Voltage Distribution in NAND Flash Memory: Characterization, Analysis, and Modeling," in DATE, 2013.*

(Continued)

*Primary Examiner* — April Y Blair
*Assistant Examiner* — Rong Tang
(74) *Attorney, Agent, or Firm* — Oblon, McClelland, Maier & Neustadt, L.L.P.

(57) ABSTRACT

According to the embodiment, a memory controller includes a memory interface which performs a first reading using a read voltage including a hard decision voltage and a second reading using a plurality of read voltages within a predetermined voltage range, a shift value calculation unit which calculates an update value of the hard decision voltage based on the reading result by the second reading, a storage unit which stores the update value, a decoding unit which performs decoding based on likelihood information according to the reading result, and a controller which makes the memory controller perform the first reading, makes the decoding unit perform the decoding by using the likelihood information using a reading result by the second reading when the decoding has been failed, and makes the memory controller perform the first reading by using the update value when the corresponding update value is stored in the storage unit.

19 Claims, 7 Drawing Sheets

(51) Int. Cl.
  *G11C 29/02* (2006.01)
  *H03M 13/37* (2006.01)
  *H03M 13/00* (2006.01)
  *G06F 11/10* (2006.01)
  *G11C 7/14* (2006.01)

(52) U.S. Cl.
  CPC .......... *G11C 29/021* (2013.01); *G11C 29/028* (2013.01); *H03M 13/3723* (2013.01); *H03M 13/6325* (2013.01); *G11C 7/14* (2013.01)

(56) References Cited

U.S. PATENT DOCUMENTS

| | | | |
|---|---|---|---|
| 9,209,835 B2 * | 12/2015 | Alhussien et al. | H03M 13/1125 |
| 2010/0208519 A1 | 8/2010 | Shiga et al. | |
| 2012/0236641 A1 * | 9/2012 | Hu | G11C 16/26 365/185.03 |
| 2015/0178154 A1 * | 6/2015 | Kim | G06F 11/1048 714/758 |
| 2015/0205664 A1 * | 7/2015 | Janik | G06F 11/1012 714/764 |
| 2015/0363264 A1 * | 12/2015 | Cai | G06F 11/1068 714/6.11 |

OTHER PUBLICATIONS

IEEE 100: The Authoritative Dictionary of IEEE Standards Terms, 7th ed., 2000. (Year: 2000).*

* cited by examiner

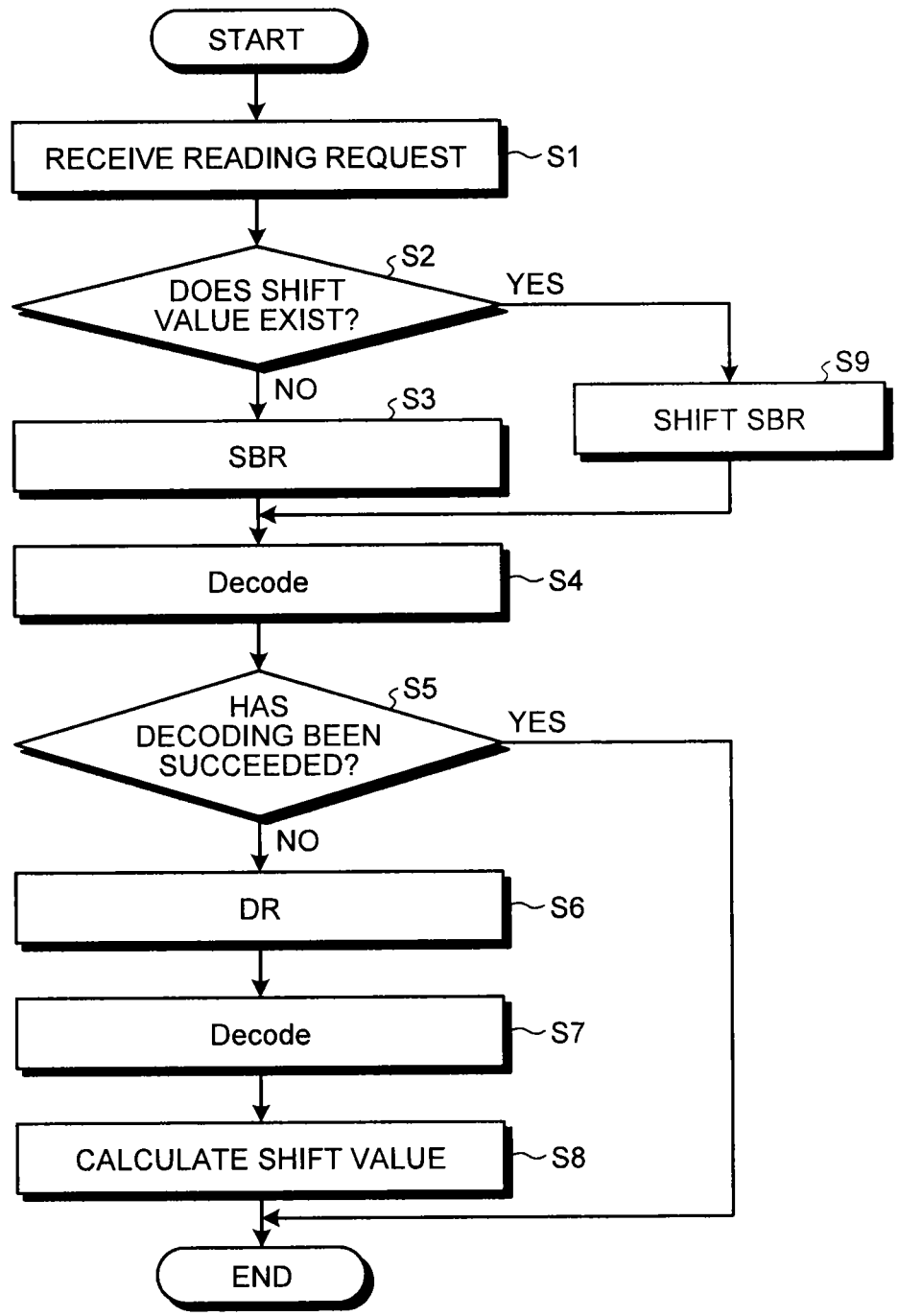

US 10,320,429 B2

MEMORY CONTROLLER, MEMORY SYSTEM AND MEMORY CONTROL METHOD

CROSS-REFERENCE TO RELATED APPLICATIONS

This application is based upon and claims the benefit of priority from U.S. Provisional Application No. 62/127,942, filed on Mar. 4, 2015; the entire contents of which are incorporated herein by reference.

FIELD

Embodiments described herein relate generally to a memory system and a memory control method.

BACKGROUND

A NAND flash memory (referred to as "NAND memory" below) stores information according to a charge amount accumulated in a floating gate of a memory cell. A voltage (read voltage) is applied to the memory cell, and the stored information can be read according to the result.

The distribution of the charge amount accumulated in the floating gate of the memory cell may change from the initial state. Therefore, an optimal reading voltage (read voltage with less reading errors) may also change.

BRIEF DESCRIPTION OF THE DRAWINGS

FIG. 9 is a diagram of an exemplary read processing procedure according to the embodiments.

DETAILED DESCRIPTION

According to the present embodiment, a memory system includes a memory interface for performing a first reading to read at a read voltage including a hard decision voltage and a second reading to read at a plurality of read voltages within a predetermined voltage range, a shift value calculation unit for calculating an update value of the hard decision voltage based on a reading result by the second reading, and a storage unit for storing the update value. Also, the memory controller includes a decoding unit for performing decoding based on likelihood information according to the reading result and a controller makes the memory controller perform the first reading, makes the decoding unit perform the decoding by using the likelihood information using a second reading result by the second reading when the decoding has been failed, and makes the storage unit perform the first reading by using the update value when the corresponding update value is stored.

A memory system and a memory control method according to the embodiment will be described in detail below with reference to the drawings. The present invention is not limited to the embodiment.

First Embodiment

Figure 1:
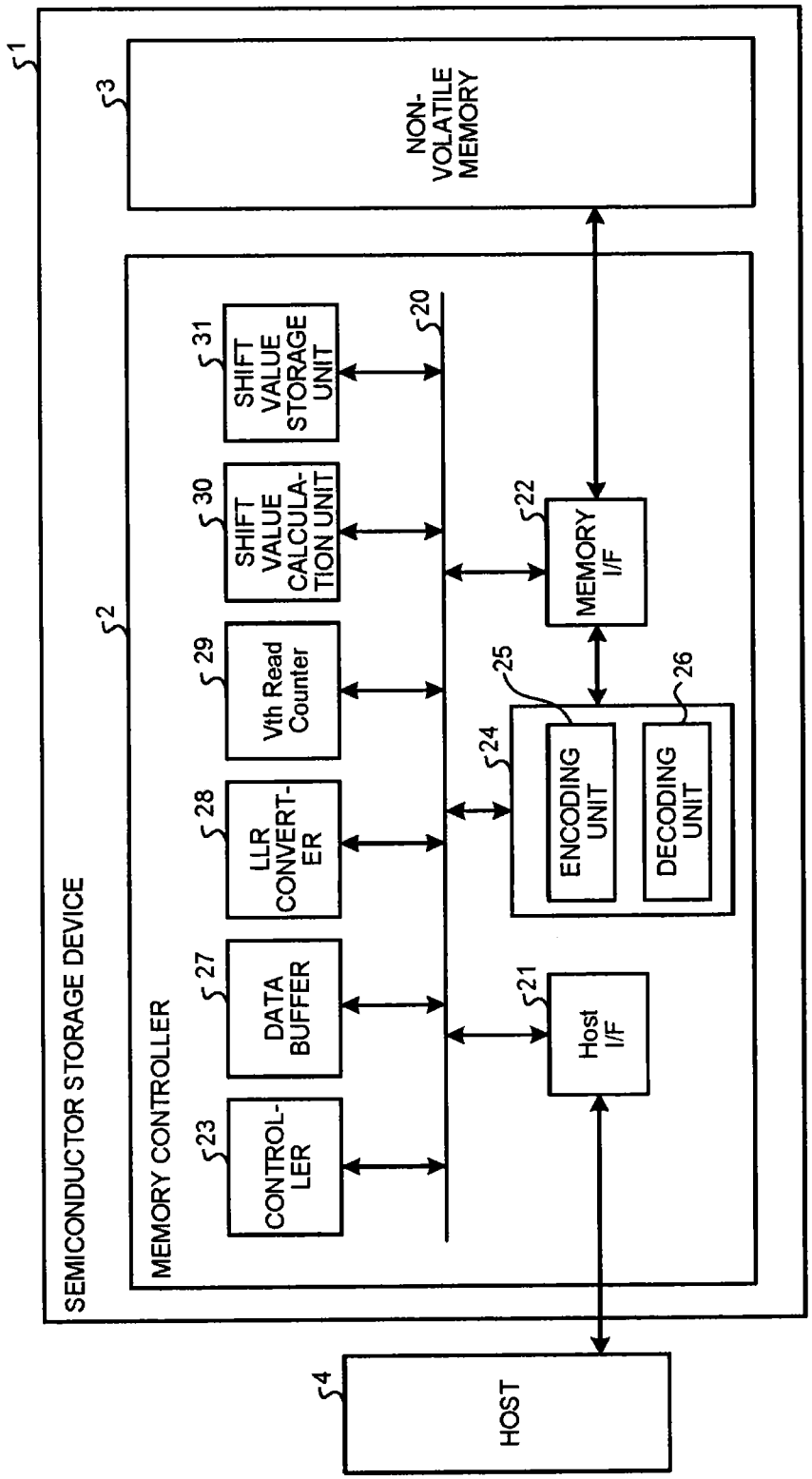
FIG. 1 is a block diagram of an exemplary structure of a storage device according to the embodiments.

FIG. 1 is a block diagram of an exemplary structure of a storage device (memory system) according to a first embodiment. A storage device 1 according to the present embodiment includes a memory controller 2 and a non-volatile memory 3. The storage device 1 can be connected to a host 4, and FIG. 1 is a diagram of a state where the storage device 1 is connected to the host 4. The host 4 is an electronic device such as a personal computer and a mobile terminal.

The non-volatile memory 3 is a non-volatile memory which stores data in a non-volatile state. For example, the non-volatile memory 3 is a NAND memory. Here, an example will be described in which the NAND memory is used as the non-volatile memory 3. However, the volatile memory 3 may be other than the NAND memory.

The memory controller 2 controls a writing to the non-volatile memory 3 according to a writing command from the host 4. Also, the memory controller 2 controls a reading from the non-volatile memory 3 according to a reading command from the host 4. The memory controller 2 includes a Host I/F 21, a memory I/F 22, a controller 23, an encoding/decoding unit 24, a data buffer 27, an LLR converter (converter) 28, a Vth Read Counter 29, a shift value calculation unit 30, and a shift value storage unit 31. The above components are connected to each other with an internal bus 20.

The Host I/F 21 outputs the command received from the host 4, user data (writing data), and the like to the internal bus 20. Also, the Host I/F 21 transmits the user data read from the non-volatile memory 3, a response from the controller 23, and the like to the host 4.

The memory I/F 22 controls processing to write the user data and the like to the non-volatile memory 3 and processing to read the user data and the like from the non-volatile memory 3 based on an instruction of the controller 23.

The encoding/decoding unit 24 includes an encoding unit 25 and a decoding unit 26. The encoding unit 25 encodes the user data and generates a code word. The decoding unit 26 decodes the code word. The encoding and decoding according to the present embodiment will be described in detail below. A low density parity check (LDPC) encoding can be used as an encoding system performed by the encoding/decoding unit 24. The encoding system is not limited to this, and an encoding system may be used in which soft decision information can be decoded as an input value. In the present embodiment, a single LDPC code word generated by the encoding unit 25 is referred to as an "ECC frame". There is no limit in the size of the ECC frame. However, in the present embodiment, it will be described by assuming that the ECC frame be data of one page which is a writing unit of the non-volatile memory 3.

The controller 23 controls totally controls the semiconductor storage device 1. The controller 23 is, for example, a central processing unit (CPU), a micro processing unit (MPU), and the like. When receiving a command from the host 4 via the Host I/F 21, the controller 23 performs control according to the command. For example, when receiving a writing request from the host 4, the controller 23 instructs the encoding unit 25 to encode the user data to be written. Also, the controller 23 instructs the memory I/F 22 to write the code word generated by the encoding unit 25 to the non-volatile memory 3. Also, when receiving a reading request from the host 4, the controller 23 instructs the memory I/F 22 to read the code word from the non-volatile memory 3. Also, the controller 23 instructs the decoding unit 26 to decode the code word read from the non-volatile memory 3. The controller 23 manages a writing destination in the non-volatile memory 3 of the code word (physical address in non-volatile memory 3).

In the present embodiment, as to be described below, at least three reading modes, i.e., soft bit read (SBR), distribution read (DR), and shift SBR are included as reading modes from the non-volatile memory 3. The shift SBR is to perform the soft bit read by changing a read voltage from a standard value. The soft bit read is a reading at the single read voltage corresponding to the hard decision and the single read voltages upper and lower than the read voltage. The distribution read is a reading to obtain an optimal reading voltage value as described below. Also, the distribution read is a reading performed, for example, at regular intervals within a predetermined voltage range wider than the range of the soft bit read. The controller 23 determines the reading mode from the non-volatile memory 3 based on the decode result of the data read from the non-volatile memory 3 and the like and instructs a reading mode to the memory I/F 22.

The data buffer 27 temporarily stores the user data received from the host 4 until it is stored in the non-volatile memory 3 and temporarily stores the data read from the non-volatile memory 3 until it is transmitted to the host 4. The data buffer 27 includes a general memory such as a static random access memory (SRAM) and a dynamic random access memory (DRAM).

The Vth Read Counter 29 is a counter for counting steps read as one for the first time for each memory cell based on the bit map data which indicates whether the current flows in the memory cell for each step of the DR read from the non-volatile memory 3 by the DR. The bit map data read from the non-volatile memory 3 by the DR will be described.

The LLR converter 28 holds two LLR tables, i.e., an LLR table for SBR and an LLR table for DR and converts the data read from the non-volatile memory 3 by the SBR into an LLR (first likelihood information) by using the LLR table for SBR. The LLR converter 28 converts the count result output from the Vth Read Counter 29 into an LLR (second likelihood information) by using the LLR table for DR.

The shift value calculation unit 30 is a calculation unit for calculating an update value to update an optimal reading voltage, that is, a hard decision voltage based on the count result of the Vth Read Counter 29 for each of the plurality of memory cells. Here, the optimal reading voltage is calculated in each block of the non-volatile memory 3. The block is a unit of erasure in the non-volatile memory 3. The optimal reading voltage is an optimal value of an HD voltage which is the read voltage used to make a hard decision of the data stored in the memory cell as zero or one. Here, the optimal reading voltage is obtained for each blocks. However, the optimal reading voltage may be obtained in a unit of the plurality of memory cells, and the unit is not limited to the block.

The shift value storage unit 31 stores the optimal reading voltage calculated by the shift value calculation unit 30 for each block. The optimal reading voltage stored in the shift value storage unit 31 is referred when the shift SBR is performed. Also, when a unit used by the shift value calculation unit 30 to obtain the optimal reading voltage is not the block, the shift value storage unit 31 may store the optimal reading voltage in a unit in which the shift value calculation unit 30 has obtained the optimal reading voltage (unit of a plurality of memory cells).

An exemplary structure in which the memory controller 2 includes the encoding/decoding unit 24 and the memory I/F 22 is illustrated in FIG. 1. However, the encoding/decoding unit 24 may be provided in the memory I/F 22. Also, the LLR converter 28 may be provided in any one of the memory I/F 22, the controller 23, or the encoding/decoding unit 24.

Figure 2:
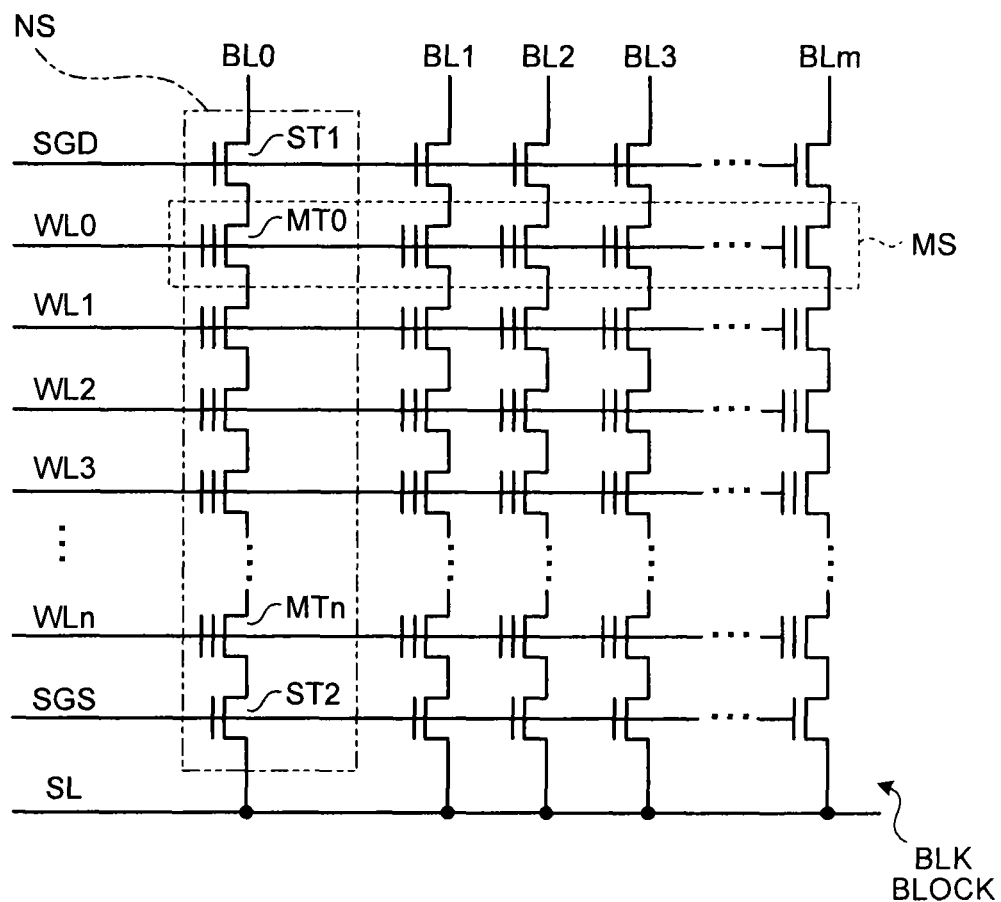
FIG. 2 is a diagram of an exemplary structure of a memory cell array of a non-volatile memory.

FIG. 2 is a diagram of an exemplary structure of a memory cell array of the non-volatile memory 3. One block of the plurality of blocks included in the memory cell array of the non-volatile memory 3 is illustrated in FIG. 2. Other blocks in the memory cell array have similar structures to that in FIG. 2. As illustrated in FIG. 2, a block BLK of the memory cell array includes (m+1) NAND strings NS (m is an integer equal to or larger than zero). Each NAND string NS includes (n+1) memory cell transistors MT0 to MTn (n is an integer equal to or larger than zero) which share a diffusion region (source region or drain region) between adjacent memory cell transistors MT and are connected in series and selection transistors ST1 and ST2 arranged at either end of a row of the (n+1) memory cell transistors MT0 to MTn.

Control gate electrodes of the memory cell transistors MT0 to MTn included in the NAND string NS are respectively connected to word lines WL0 to WLn. Also, the memory cell transistors MTi (i=0 to n) of each NAND string NS are commonly connected by the same word line WLi (i=0 to n). That is, the control gate electrodes of the memory cell transistors MTi in the same row in the block BLK are connected to the same word line WLi.

Each of the memory cell transistors MT0 to MTn includes a field effect transistor having a stacked gate structure formed on a semiconductor substrate. Here, the stacked gate structure includes a charge storage layer (floating gate electrode) formed on the semiconductor substrate with a gate insulating film interposed therebetween and the control gate electrode formed on the charge storage layer with the gate insulating film interposed therebetween. Threshold voltages of the memory cell transistors MT0 to MTn change according to the number of electrons accumulated in the floating gate electrode, and the memory cell transistors MT0 to MTn can store the data according to a difference between the threshold voltages.

Drains of the (m+1) selection transistors ST1 in the single block BLK are respectively connected to bit lines BL0 to BLm, and gates are commonly connected to a selection gate line SGD. Also, a source of the selection transistor ST1 is connected to a drain of the memory cell transistor MT0. Similarly, sources of the (m+1) selection transistors ST2 in the single block BLK are commonly connected to a source line SL, and gates are commonly connected to a selection gate line SGS. Also, the drain of the selection transistor ST2 is connected to a source of the memory cell transistor MTn.

Each memory cell is connected to the word line and the bit line. Each memory cell can be identified according to an address to identify the word line and an address to identify the bit line. As described above, the data of the memory cell (memory cell transistor MT) in the same block BLK is collectively deleted. On the other hand, the data is read and written in a unit of a plurality of memory cells, that is, a memory cell group MS. The memory cell group MS is commonly connected to any one of the word lines WL.

As described above, the non-volatile memory 3 is a NAND memory in the present embodiment. In the NAND memory, the electrons are injected at the timing of writing the data according to a data value so that the number of electrons (charge amount) of the floating gate corresponds to any one of the plurality of regions (threshold region). Here, to simplify the description, an example of one bit/cell will be described in which a single memory cell stores one bit. In a case of the one bit/cell, one of the two threshold regions corresponds to "zero", and another one corresponds to "one". When a voltage is applied to the memory cell, a current flows in a case where a voltage equal to or more than a voltage value according to the charge amount of the memory cell is applied. A current does not flow in a case where the voltage less than the voltage value is applied. Therefore, the voltage which is a boundary between the above two voltages is determined according to the charge amount of the memory cell for each memory cell. The voltage determined according to the charge amount of the memory cell is referred to as a "threshold voltage" here. Therefore, an electric charge is injected in an initial state so as to correspond to either one of the two threshold regions, and a reference read voltage which is a boundary of the two threshold regions is applied to the memory cell at the time of reading. Accordingly, it can be determined whether the data stored in the memory cell is one or not. The threshold voltages of each memory cell vary, and a frequency distribution of the memory cell for each threshold voltage is referred to as "distribution of the thresholds".

Figure 3:
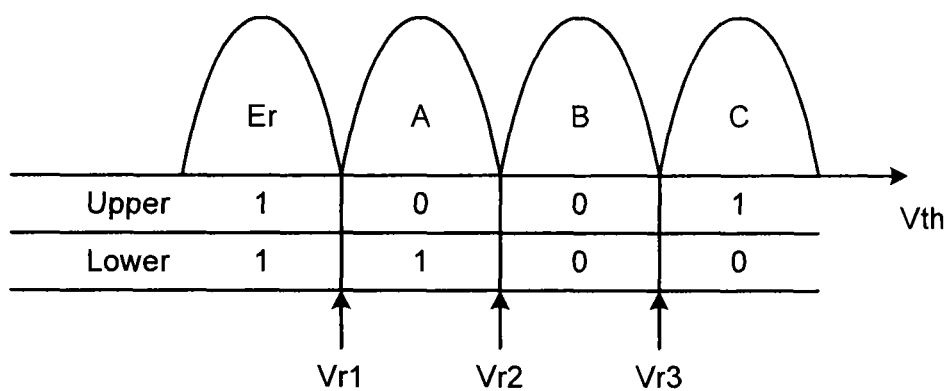
FIG. 3 is a diagram of an exemplary data coding and distribution of thresholds according to the embodiments.

FIG. 3 is a diagram of an exemplary data coding and distribution of the thresholds according to the present embodiment. An example is illustrated in FIG. 3 in which two bit/cell memory which can store two bits per memory cell is used as the memory cell of the non-volatile memory 3. As illustrated in FIG. 3, an Er level corresponds to a data value of "11", and an A level corresponds to a data value of "01". A B level corresponds to a data value of "00", and a C level corresponds to a data value of "10". The Er level, the A level, the B level, and the C level respectively indicate threshold regions. In the two bit/cell memory cell, four threshold regions correspond to two-bit data values as illustrated in FIG. 3. The horizontal axis indicates a threshold voltage Vth in FIG. 3. A chevron shape illustrated on the upper side in FIG. 3 schematically represents the distribution of the thresholds. The bits of the two bit/cell memory cells are an Upper bit and Lower bit. The upper bits of the memory cells commonly connected to the single word line are included in an Upper page, and the Lower bits of the memory cells commonly connected to the single word line correspond to a Lower page.

In the present embodiment, when it is assumed that $D_u$ be the data of the Upper page and $D_L$ be the data of the Lower page, the data value of two bits is written as "$D_u D_L$". A data coding illustrated in FIG. 3 is an example and is not limited to the example in FIG. 3. It is assumed that a threshold voltage to be a boundary between the Er level and the A level (referred to as "boundary voltage" below) be Vr1 and a boundary voltage between the A level and the B level be Vr2. Also, it is assumed that a boundary voltage between the B level and the C level be Vr3.

However, the NAND memory has an error factor such as a data retention error, a read disturb error, and a read disturb defect. The charge amount of the floating gate is changed by these error factors. Therefore, a reading error may occur when the reading is performed by using the reference read voltage which has been set first. The data is encoded and stored in the non-volatile memory 3 in the present embodiment so that the data can be correctly restored even when the reading error occurs. When the data is read from the non-volatile memory 3, the data is decoded. However, as one of the decoding methods to realize an error correction capability, there is a decoding performed by using the soft decision information (soft bit information), that is, the likelihood information.

In the present embodiment, the decoding unit 26 performs decoding processing for using the soft decision information, that is, the likelihood information. Therefore, the reading from the non-volatile memory 3 is performed according to the soft bit read in order to obtain the likelihood information. In the soft bit read, when it is assumed that a voltage to be a determination criteria of the bit value, that is, a voltage to make the hard decision be a hard bit read voltage (HB), the reading according to the HB, a read voltage which is shift to the upper side from the HB, and a read voltage which is shifted to the lower side from the HB is performed.

Figure 4:
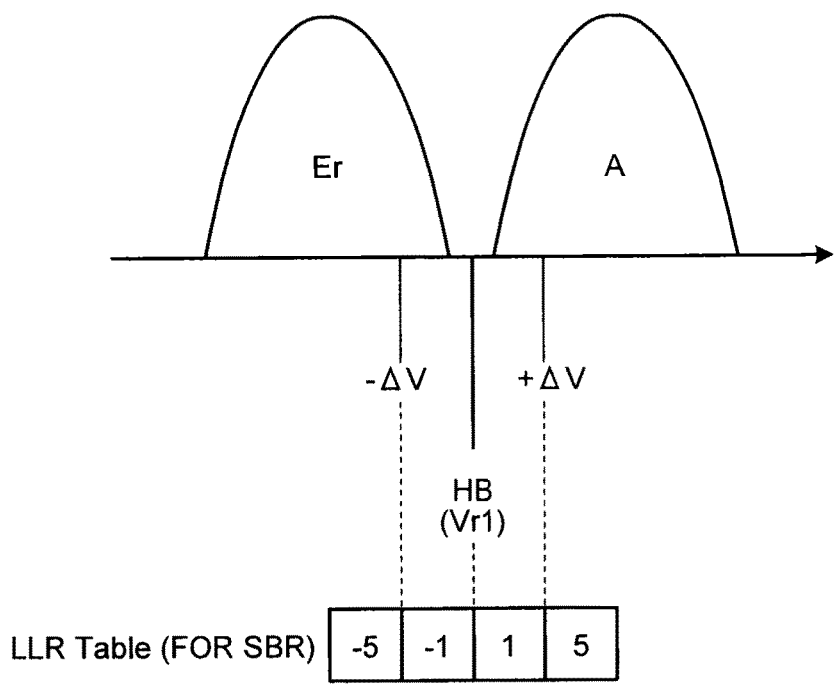
FIG. 4 is a diagram of an exemplary read voltage to be applied at the time of soft bit read.

FIG. 4 is a diagram of an exemplary read voltage to be applied at the time of soft bit read. The read voltage applied in the soft bit read when it is assumed that the boundary voltage Vr1 between the Er level and the A level be the HB is illustrated in FIG. 4. In the example in FIG. 4, the HB, a point on the upper side of the HB (+ΔV), and a point on the lower side of the HB (−ΔV) are applied. In the soft bit read in a case where it is assumed that the boundary voltages Vr2 and Vr3 be the HB, the read voltages at the single points on the upper and lower side of the HB are similarly applied. In the soft bit read, it is not necessary that the number of the read voltages applied to the sides upper and lower than the HB be one.

An example of a soft bit read LLR table is illustrated on the lower side of the FIG. 4. When the three read voltages, i.e., the HB, the HB−ΔV, and the HB+ΔV have been applied, the soft bit read LLR table can recognize the region where the threshold voltage of each memory cell is located according to whether the current flows. The above region is one of four regions, i.e., a region equal to or less than the HB−ΔV, a region larger than the HB−ΔV and equal to or less than the HB, a region larger than the HB and equal to or less than the HB+ΔV, and a region larger than the HB+ΔV. The non-volatile memory 3 outputs the information that the threshold voltage of each memory cell is located in which region of the four regions as a reading result of the soft bit read. The LLR converter 28 of the memory controller 2 obtains the LLR by converting the reading result for each memory cell into the LLR based on the reading result and the soft bit read LLR table. The LLR is input to the decoding unit 26, and the decoding unit 26 performs the decoding by using the LLR.

As described in FIG. 4, when the reading is performed at the HB, the single point on upper side of the HB, and the single point on the lower side of the HB, the number of read voltages applied at one reading is three. The data can be rapidly read from the non-volatile memory 3. However, the LLR is obtained as any one of the four values, and the accuracy of the LLR is not high. Therefore, when a deviation amount of the threshold voltage of the memory cell increases, it can also be considered that the decoding is failed.

In this case, the reading error may be reduced when the voltage value of the HB is changed to an appropriate value. The SBR in which the voltage value of the HB is changed in this way is referred to as a "shift SBR". At the time of the shift SBR, a position of the HB is changed from the standard value, and the reading is performed at three read voltages, i.e., the HB after the change, the HB−ΔV after the change, and the HB+ΔV after the change. The reading called as a "distribution read" may be performed in order to obtain the value of the HB to be used in the shift SBR.

Figure 5:
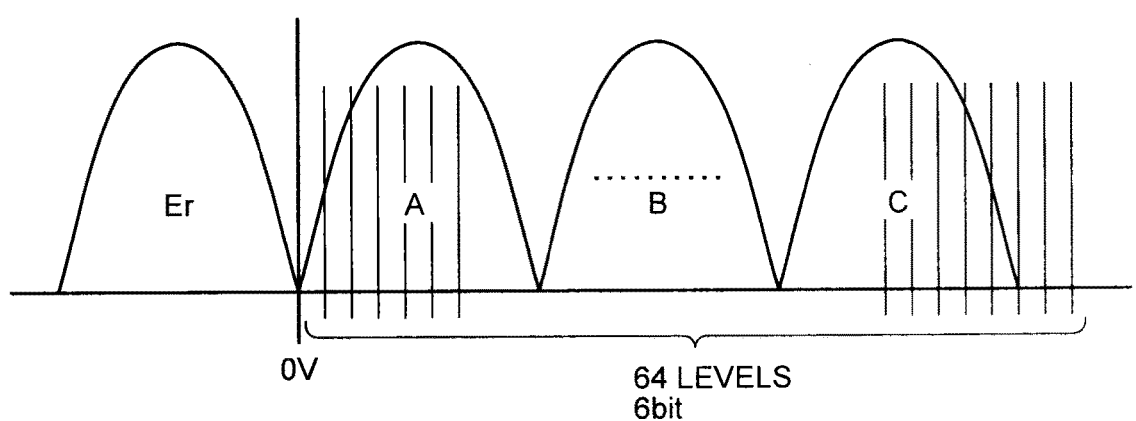
FIG. 5 is a diagram of an exemplary distribution read.

FIG. 5 is a diagram of an exemplary distribution read. As illustrated in FIG. 5, in the distribution read, the reading is performed, for example, at voltage having regular intervals (referred to as "step" below) within a predetermined voltage range. As illustrated in FIG. 5, the predetermined voltage range, which is different from that in the soft bit read, is not a range near the boundary. The predetermined voltage range is a region over a plurality of threshold regions. In FIG. 5, an example is illustrated in which the reading is performed with 64 levels, that is, 64 steps within the predetermined voltage range. The number of steps in the distribution read is not limited to 64. A predetermined range to which the voltage is applied in the distribution read is not limited to that of the example in FIG. 5. The predetermined range may be wider or narrower than that of the example in FIG. 5. Also, it is not necessary that the voltage intervals of the voltage value which is applied within the predetermined range in the distribution read be regular intervals. Also, the example of the two bit/cell is illustrated in FIG. 5. However, in a case of the one bit/cell or three bit/cell, the distribution read can be similarly performed.

In the distribution read, the reading result (whether the current has flowed) for each of the 64 steps illustrated in FIG. 5 can be obtained. The step is determined which corresponds to a region where threshold voltage of each memory cell is located. For example, it is assumed that the lowest voltage in 64 steps be step 0, and after that, the voltages in order from the lowest be steps 1, 2, . . . . At this time, in a case where the current flows at the voltage of step 0, the threshold voltage of the memory cell is equal to or less than the voltage value of step 0. When the current does not flow at the voltage of step 0 and flows at the voltage of step 1, the threshold voltage of the memory cell is more than the voltage value of step 0 and equal to or less than the voltage value of step 1. In this way, it is determined for each memory cell at which step the current flows, and the frequency of the memory cells, that is, the number of times corresponding to each step is obtained by using the determination result of the plurality of memory cells (for example, one block). Then, data corresponding to an actual measured value of the distribution of threshold can be obtained.

Figure 6:
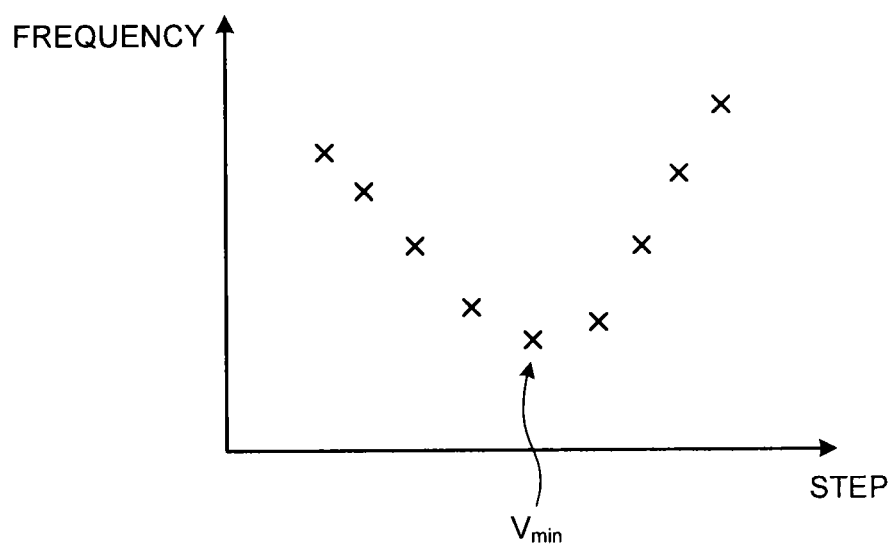
FIG. 6 is a schematic diagram of an exemplary frequency of the memory cells for each step.

FIG. 6 is a schematic diagram of an exemplary frequency of the memory cells for each step. The frequency (the number) of the memory cell corresponding to the voltage value of each step to be applied in the distribution read is illustrated in FIG. 6. FIG. 6 is a diagram in which a region near the boundary voltage between the levels illustrated in FIG. 3 is enlarged. Ideally, it is preferable that two distributions in the left and right of the boundary voltage be completely separated. However, the two distributions are not completely separated in reality. Therefore, the shift value calculation unit 30 estimates a voltage having the smallest frequency, that is, a voltage to be bottoms of valleys of two mountains in FIG. 6, for example, from the result illustrated in FIG. 6. The shift value calculation unit 30 assumes that the estimated voltage be an optimal reading voltage $V_{min}$. The voltage to be the bottom of the valley may be estimated by using any methods. For example, the voltage of a position where the frequency becomes the smallest may be used as $V_{min}$. Also, an approximate curve may be obtained according to a least squares method and the like, and it may be assumed that the bottom of the approximate curve be $V_{min}$. In the present embodiment, the optimal reading voltage obtained by the distribution read is stored in the shift value storage unit 31 for each block as a shift value. When the soft bit read of the block in which the shift value is stored in the shift value storage unit 31 is performed, the reading is performed according to shift soft bit read by using the shift value stored in the shift value storage unit 31.

The above-mentioned distribution read and the calculation of the optimal reading voltage are performed, for example, when the decoding has been performed by using the LLR obtained as a result of the SBR and the decoding has been failed. The calculated optimal reading voltage is stored in the shift value storage unit 31 for each block as described above. Generally, the data obtained by the distribution read is used to obtain the optimal reading voltage.

On the other hand, when the decoding has been failed, a method for increasing the number of read voltages used in the soft bit read can be considered in order to increase the accuracy of the LLR. When this method is used, a method may be used in which a second SBR for reading at the HB and at three points each on the upper and lower sides of the HB and the decoding is performed by using the LLR obtained by the second SBR, for example, in a case where a first SBR for reading at the HB and a single point each on the upper and lower sides of the HB and the decoding by using the LLR obtained by the first SBR has been failed. However, when the first SBR has been performed and the decoding performed by using the LLR obtained by the first SBR has been failed, it takes time to read in a case where the above-mentioned distribution read is performed, and in addition, the second SBR is performed. Also, in the distribution read, the reading at the read voltage including the read voltage approximately equivalent to the SBR is performed in actual. However, both the distribution read and the second SBR are performed, and an unnecessary reading occurs.

Therefore, in the present embodiment, when the reading has been performed at the HB and the single point each on upper and lower sides of the HB and the decoding has been failed, the LLR is obtained by using the reading result obtained at the time of the distribution read without using the above-mentioned second SBR. The decoding is performed by using the obtained LLR. Accordingly, the unnecessary reading can be avoided, and the accuracy of the LLR can be improved.

Figure 7:
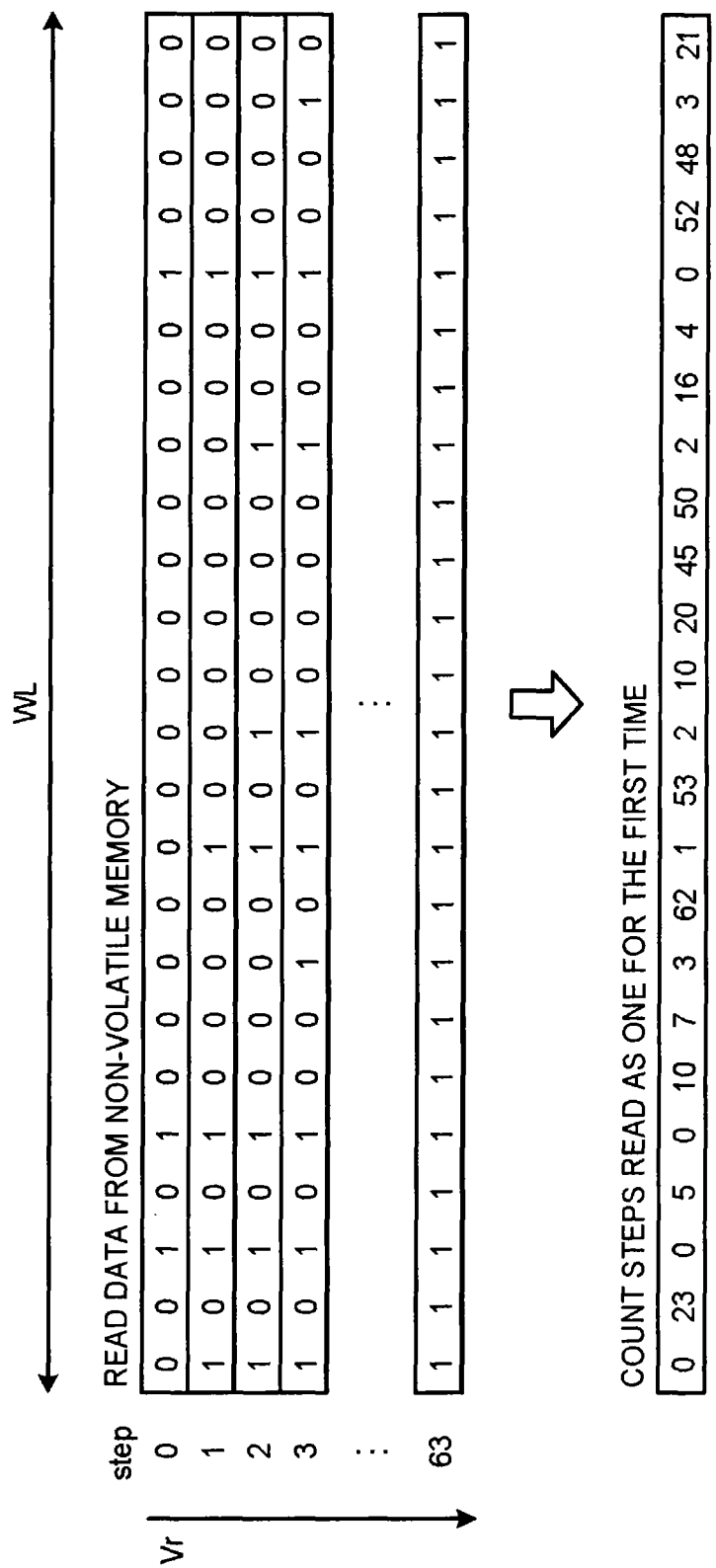
FIG. 7 is a diagram of an exemplary read result by the distribution read.

FIG. 7 is a diagram of an exemplary read result by the distribution read. The horizontal direction in FIG. 7 indicates read data from each memory cell connected to the same word line. The vertical direction indicates the reading result for each voltage value of each step applied in the distribution read for each memory cell. It is assumed that the reading result in a case where the current flows be one and that in a case where the current does not flow be zero. Therefore, for example, the leftmost memory cell indicates a state where the current has not flowed at the voltage value of step 0 and the current has flowed at the voltage value of step 1. In the distribution read, the bit map data of zero and one like this is output from the non-volatile memory 3.

The Vth Read Counter 29 of the memory controller 2 determines whether the data is zero for each memory cell in an order of step numbers from the smallest based on the bit map data output from the non-volatile memory 3. Then, the Vth Read Counter 29 counts the step (step number) in which the number becomes one from zero. Accordingly, the step corresponding to the threshold voltage of each memory cell can be obtained.

Figure 8:
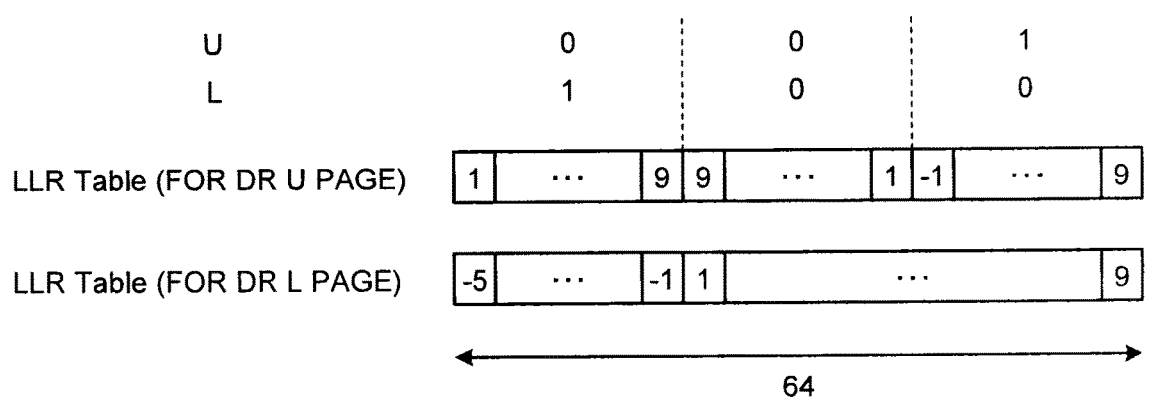
FIG. 8 is a diagram of an exemplary LLR table for DR.

FIG. 8 is a diagram of an exemplary LLR table for DR. The LLR converter 28 holds two tables for Upper page (LLR table (for DR Upper)) and for Lower page (LLR table (for DR Lower)) as the LLR table for DR. The LLR converter 28 selects the LLR table to be used according which one of the Upper page or the Lower page is a page to be read. The controller 23 instructs which one of the Upper page or the Lower page is the page to be read. As illustrated in FIG. 8, the LLR is set so that the absolute value of the LLR near the boundary of bit values becomes smaller in each page and the absolute value of the LLR apart from the boundary becomes larger. Since the number of steps is 64, a resolution of the LLR is significantly higher than that of the SBR. The decoding unit 26 performs the decoding by using the LLR converted by the LLR converter 28.

FIG. 9 is a diagram of an exemplary read processing procedure according to the present embodiment. As illustrated in FIG. 9, when receiving the reading request from the host 4 (step S1), the controller 23 refers to the shift value storage unit 31 and determines whether the shift value of the block where the data to be read is stored exists in the shift value storage unit 31 (step S2). When there is no shift value (step S2 No), the controller 23 instructs the memory I/F 22 to perform the soft bit read by using the standard HB. The memory I/F 22 performs the reading by the soft bit read from the non-volatile memory 3 (step S3). The LLR converter 28 converts the reading result by the soft bit read into the LLR as described above.

Next, the controller 23 instructs the decoding unit 26 to perform the decoding, and the decoding unit 26 performs the decoding based on the LLR output from the LLR converter 28 (step S4). The decoding unit 26 notifies the controller 23 that whether the decoding has been succeeded. The controller 23 determines whether the decoding has been succeeded based on the notification from the decoding unit 26 (step S5). When the controller 23 has determined that the decoding has been succeeded (step S5 Yes), the processing is terminated. When the controller 23 has determined that the decoding has been failed (step S5 No), the controller 23 instructs the memory I/F 22 to perform the distribution read and the memory I/F 22 performs the reading by the distribution read from the non-volatile memory 3 (step S6). The LLR converter 28 converts the reading result by the distribution read into the LLR as described above.

Next, the controller 23 instructs the decoding unit 26 to perform the decoding, and the decoding unit 26 performs the decoding based on the LLR output from the LLR converter 28 (step S7). Also, the shift value calculation unit 30 calculates the shift value, that is, the optimal reading voltage as described above based on the reading result by the distribution read and stores it in the shift value storage unit 31 as the shift value (step S8). Then, the processing is terminated.

On the other hand, when it has been determined in step S2 that there is the shift value (step S2 Yes), the shift SBR is performed (step S9). The shift SBR is the soft bit read of which the HB is changed to the shift value. The LLR converter 28 converts the reading result by the soft bit read into the LLR as described above. A LLR conversion table in the shift SBR may be the same as that of the soft bit read. After that, the procedure proceeds to step S4.

Both the soft bit read performed by using the standard HB and the shift SBR performed by using the shift value are the first reading including the voltage to make the hard decision. The distribution read is the second reading for performing the reading at a plurality of voltages within a predetermined voltage range in order to obtain the optimal value of the voltage to make the hard decision.

In the present embodiment, an example has been described in which the soft bit read is performed in step S3. However, a hard bit read may be performed in step S3 instead of the soft bit read. The hard bit read is a reading to determine the data stored in the memory cell as zero or one by using the HB described above. In this case, for example, it is specified that the LLR be +1 when the reading result is zero and the LLR be −1 when the reading result is one. In step S9, a shift hard bit read is performed by using the shift value as the HB. That is, in this case, the first reading is the hard bit read and the shift hard bit read.

As described above, in the present embodiment, when the decoding performed by using the reading result by the soft bit read or the hard bit read has been failed, the distribution read to calculate the shift value is performed. Then, the LLR is obtained by using the reading result by the distribution read, and the decoding is performed by using the obtained LLR. Therefore, overlapped reading can be avoided, and the accuracy of the LLR can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory that includes a plurality of memory cells, each of the memory cells having a storage capacity of m bits in accordance with 2 to the power of m threshold voltage distributions, the 2 to the power of m threshold voltage distributions including a first threshold voltage distribution and at least one other threshold voltage distribution, the first threshold voltage distribution indicating an erase state, the at least one other threshold voltage distribution being higher than the first threshold voltage distribution and indicating a write state, where m is a natural number that is equal to or greater than 2; and
processing circuitry configured to
perform a first reading, the first reading being reading data from the non-volatile memory, the first reading including a reading performed by using a hard decision voltage, a reading performed by using a first read voltage lower than the hard decision voltage, and a reading performed by using a second read voltage higher than the hard decision voltage, the hard decision voltage being a voltage for a hard decision of the data stored in the non-volatile memory,
convert first data read by the first reading into first likelihood information,
decode data read from the non-volatile memory based on the first likelihood information,
perform, in a case where the decoding based on the first likelihood information has failed, a second reading, the second reading being reading a plurality of data sets from the non-volatile memory with a plurality of steps, the plurality of steps being performed serially, each of the plurality of steps corresponding to each of a plurality of read voltages at predetermined intervals within a certain voltage range, each of the plurality of data sets corresponding to each of the plurality of read voltages, calculate the hard decision voltage using the plurality of data sets, update the hard decision voltage with the calculated hard decision voltage, convert the plurality of data sets into second likelihood information, and decode data read from the non-volatile memory based on the second likelihood information, wherein the 2 to the power of m threshold voltage distributions are the first threshold voltage distribution and a second to a k-th threshold voltage distribution, where k is 2 to the power of m, a voltage corresponding to the (n+1)-th threshold voltage distribution is higher than a voltage corresponding to the n-th threshold voltage distribution, where n is natural number equal to or greater than 1 and smaller than k, in the first reading using the hard decision voltage between a center of the n-th threshold voltage distribution and a center of the (n+1)-th threshold voltage distribution, the first read voltage and the second read voltage are higher than the center voltage of the n-th threshold voltage distribution and lower than the center voltage of the (n+1)-th threshold voltage distribution, a voltage range between the first read voltage and the second read voltage is narrower than a range from the n-th threshold voltage distribution to the (n+1)-th threshold voltage distribution, the certain voltage range is a range over the second to the k-th threshold voltage distributions, each of the plurality of data sets includes a plurality of bits, each of the plurality of bits indicating whether current flows in each of the plurality of memory cells, the processing circuitry calculates the number of memory cells in the plurality of memory cells, and a threshold voltage of which being corresponding to one of the plurality of read voltages, based on the plurality of bits, with respect to each of the plurality of read voltages, and the processing circuitry calculates the hard decision voltage based on the calculated number of memory cells.

2. The memory system according to claim 1, wherein the processing circuitry stores the updated hard decision voltage, and uses the updated hard decision voltage in the first reading.

3. The memory system according to claim 2, wherein the processing circuitry calculates the update value for each block which is a data erasing unit in the non-volatile memory.

4. The memory system according to claim 1, wherein the plurality of data sets used in the calculating of the hard decision voltage are the same as the plurality of data sets converted into the second likelihood information.

5. The memory system according to claim 1, wherein the processing circuitry selects from among the plurality of read voltages, the read voltage corresponding to data, of which values of the plurality of read data items change, in the plurality of read data items respectively corresponding to the plurality of read voltages, and obtains the second likelihood information based on the selected read voltage.

6. The memory system according to claim 5, wherein the processing circuitry obtains the first likelihood information based on a first likelihood information table corresponding to a first bit among m bits and including values respectively corresponding to the plurality of read voltages when the read data corresponds to the first bit, and obtains the second likelihood information based on a second likelihood information table corresponding to a second bit among m bits and including values respectively corresponding to the plurality of read voltages when the read data corresponds to the second bit, the second bit being different from the first bit.

7. The memory system according to claim 1, wherein the data which is stored in the non-volatile memory is a code word based on a LDPC.

8. A method for controlling a non-volatile memory, the non-volatile memory including a plurality of memory cells, each of the memory cells having a storage capacity of m bits in accordance with 2 to the power of m threshold voltage distributions, the 2 to the power of m threshold voltage distributions including a first threshold voltage distribution and at least one other threshold voltage distribution, the first threshold voltage distribution indicating an erase state, the at least one other threshold voltage distribution being higher than the first threshold voltage distribution and indicating a write state, where m is a natural number that is equal to or greater than 2, the method comprising:

performing, via processing circuitry, a first reading to read data from the non-volatile memory, the first reading including a reading performed by using a hard decision voltage, a reading performed by using a first read voltage lower than the hard decision voltage, and a reading performed by using a second read voltage higher than the hard decision voltage, the hard decision voltage being a voltage for a hard decision of the data stored in the non-volatile memory;

converting first data read by the first reading into first likelihood information;

decoding data read from the non-volatile memory based on the first likelihood information;

performing, in a case where the decoding based on the first likelihood information has failed, a second reading, the second reading being reading a plurality of data sets from the non-volatile memory with a plurality of steps, the plurality of steps being performed serially, each of the plurality of steps corresponding to each of a plurality of read voltages at predetermined intervals within a certain voltage range, each of the plurality of data sets corresponding to each of the plurality of read voltages;

calculating the hard decision voltage using the plurality of data sets;

updating the hard decision voltage with the calculated hard decision voltage;

converting the plurality of data sets into second likelihood information; and decoding data read from the non-volatile memory based on the second likelihood information, wherein the 2 to the power of m threshold voltage distributions are the first threshold voltage distribution and a second to a k-th threshold voltage distribution, where k is 2 to the power of m, a voltage corresponding to the (n+1)-th threshold voltage distribution is higher than a voltage corresponding to the n-th threshold voltage distribution, where n is natural number equal to or greater than 1 and smaller than k, the certain voltage range is a range over the second to the k-th threshold voltage distributions, in the first reading using the hard decision voltage between a center of the n-th threshold voltage distribution and a center of the (n+1)-th threshold voltage distribution, the first read voltage and the second read voltage are higher than the center voltage of the n-th threshold voltage distribution and lower than the center voltage of the (n+1)-th threshold voltage distribution, a voltage range between the first read voltage and the second read voltage is narrower than a range from the n-th threshold voltage distribution to the (n+1)-th threshold voltage distribution, each of the plurality of data sets includes a plurality of bits, each of the plurality of bits indicating whether current flows each of the plurality of memory cells, the processing circuitry calculates the number of memory cells in the plurality of memory cells, and a threshold voltage of which being corresponding to one of the plurality of read voltages, based on the plurality of bits, with respect to each of the plurality of read voltages, and the processing circuitry calculates the hard decision voltage based on the calculated number of memory cells.

9. The method according to claim 8, further comprising:
calculating an update value of the hard decision voltage based on the data read from the plurality of memory cells by the second reading; and
using the updated hard decision voltage in the first reading.

10. The method according to claim 9, further comprising:
calculating the update value for each block which is a data erasing unit in the non-volatile memory.

11. The method according to claim 8, wherein the plurality of data sets used in the calculating of the hard decision voltage are the same as the plurality of data sets converted into the second likelihood information.

12. The method according to claim 8, wherein the converting into the second likelihood information includes
selecting from among the plurality of read voltages, the read voltage corresponding to data, of which values of the plurality of read data items change, in the plurality of read data items respectively corresponding to the plurality of read voltages, and obtaining the second likelihood information based on the selected read voltage.

13. The method according to claim 12, wherein the method further comprises:
obtaining the first likelihood information based on a first likelihood information table corresponding to a first bit among m bits and including values respectively corresponding to the plurality of read voltages when the read data corresponds to the first bit of two or more bits; and
obtaining the second likelihood information based on a second likelihood information table corresponding to a second bit among m bits and including values respectively corresponding to the plurality of read voltages when the read data corresponds to the second bit, the second bit being different from the first bit.

14. The method according to claim 8, wherein the data which is stored in the non-volatile memory is a code word based on a LDPC.

15. The memory system according to claim 1, wherein the predetermined intervals of the plurality of read voltages are equal.

16. The memory system according to claim 1, wherein the predetermined intervals of the plurality of read voltages are not equal.

17. The method according to claim 8, wherein the predetermined intervals of the plurality of read voltages are equal.

18. The method according to claim 8, wherein the predetermined intervals of the plurality of read voltages are not equal.

19. The memory system according to claim 1, wherein
the hard decision voltage is determined based on a bottom of a curve indicating the number of memory cells as a function for read voltage, and
the curve is calculated by curve fitting using the calculated number of memory cells with respect to each of the plurality of read voltages.

* * * * *